(12) United States Patent
Stanley (10) Patent No.: US 8,008,893 B2
(45) Date of Patent: Aug. 30, 2011

(54) BATTERY ANALYSIS SYSTEM

(75) Inventor: Joel Ray Stanley, Dryden, MI (US)

(73) Assignee: Cobasys, LLC, Orion, MI (US)

( * ) Notice: Subject to any disclaimer, the term of this patent is extended or adjusted under 35 U.S.C. 154(b) by 417 days.

(21) Appl. No.: 12/401,218

(22) Filed: Mar. 10, 2009

(65) Prior Publication Data

US 2010/0201322 A1 Aug. 12, 2010

Related U.S. Application Data

(60) Provisional application No. 61/150,559, filed on Feb. 6, 2009.

(51) Int. Cl.
*H02J 7/00* (2006.01)
(52) U.S. Cl. ......................... 320/136; 320/128
(58) Field of Classification Search .................. 320/128, 320/136
See application file for complete search history.

(56) References Cited

U.S. PATENT DOCUMENTS

| 7,888,912 B2 * | 2/2011 | Morita et al. ................. 320/132 |
| 7,902,828 B2 * | 3/2011 | Huang ........................... 324/430 |
| 2004/0012373 A1 * | 1/2004 | Sakakibara et al. .......... 320/132 |
| 2008/0120050 A1 * | 5/2008 | Iwane et al. ..................... 702/63 |

OTHER PUBLICATIONS

Electropaedia; "Battery and Energy Technologies" (State of Charge (SOC) Determination) Woodbank Communications Ltd. 2005; pp. 1-13; http:/www.mpoweruk.com/soc.htm.
"PNGV Battery Test Manual", DOE/ID-10597, Revision 3; Published Feb. 2001; Prepared for the US Department of Energy, Assistant Secretary for Energy Efficiency and Renewable Energy (EE) Idaho Operations Office, Contract DE-AC07-99ID13727; 126 Pages.

* cited by examiner

*Primary Examiner* — Bot Ledynh (57) ABSTRACT

A battery analysis system includes a control module, a measurement module, and a pulse power module. The control module controls current to a battery to one of charge and discharge the battery. The measurement module determines N voltages across the battery at N times during a period when the control module controls the current and when the battery is at a predetermined temperature and a predetermined state of charge. N is an integer greater than 1. The pulse power module determines N resistances corresponding to the current and the N voltages across the battery and determines a pulse power value of the battery based on the N resistances. The pulse power value indicates a dynamic power of the battery to one of charge and discharge.

23 Claims, 4 Drawing Sheets

BATTERY ANALYSIS SYSTEM

CROSS-REFERENCE TO RELATED APPLICATIONS

This application claims the benefit of U.S. Provisional Application No. 61/150,559, filed on Feb. 6, 2009. The disclosure of the above application is incorporated herein by reference.

FIELD

The present disclosure relates to battery systems, and more particularly to a system for analyzing pulse power capability of a battery.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A vehicle may include a rechargeable battery (hereinafter "battery") as an energy storage system. For example, a hybrid electric vehicle may include a Li-ion, NiMH, or other chemistry battery. Batteries may be recharged by the application of electrical energy. For example, a current may be applied to batteries to restore charge.

A pulse power capability of the battery indicates a dynamic power capability of the battery to deliver discharge current or receive charge current during a period. The pulse power capability of the battery may depend on a state of charge (SOC) of the battery. The SOC of the battery refers to the energy capacity of the battery relative to a rated energy capacity of the battery. For example, a fully charged battery may include a 100% SOC, a fully discharged battery may include a 0% SOC. The capacity of the battery may reduce as the battery ages. The capacity of the battery may also be affected by environmental conditions (e.g., temperature).

SUMMARY

A battery analysis system comprises a control module, a measurement module, and a pulse power module. The control module controls current to a battery to one of charge and discharge the battery. The measurement module determines N voltages across the battery at N times during a period when the control module controls the current and when the battery is at a predetermined temperature and a predetermined state of charge. N is an integer greater than 1. The pulse power module determines N resistances corresponding to the current and the N voltages across the battery and determines a pulse power value of the battery based on the N resistances. The pulse power value indicates a dynamic power of the battery to one of charge and discharge.

A battery analysis system comprises a control module, a measurement module, and a pulse power module. The control module controls voltage across a battery to one of charge and discharge the battery. The measurement module determines N currents through the battery at N times during a period when the control module controls the voltage and when the battery is at a predetermined temperature and a predetermined state of charge. N is an integer greater than 1. The pulse power module determines N resistances corresponding to the voltage and the N currents through the battery and determines a pulse power value of the battery based on the N resistances. The pulse power value indicates a dynamic power of the battery to one of charge and discharge.

A method comprises setting a temperature of a battery to a predetermined temperature and discharging the battery when the battery is at the predetermined temperature and a predetermined state of charge. The method further comprises determining a plurality of resistances based on a voltage across the battery and current through the battery when the battery is discharging at the predetermined temperature. Additionally, the method comprises determining a pulse power value of the battery based on the plurality of resistances. The pulse power value indicates a dynamic power of the battery to one of charge and discharge.

BRIEF DESCRIPTION OF THE DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features. As used herein, the term module refers to an application specific integrated circuit (ASIC), an electronic circuit, a processor (shared, dedicated, or group) and memory that executes one or more software or firmware programs, a combinational logic circuit, and/or other suitable components that provide the described functionality.

A pulse power characterization test determines the dynamic power of the battery to deliver discharge current or receive charge current during a period. Typically, a pulse power characterization test determines the dynamic power of the battery based on the state of charge (SOC) of the battery. The battery analysis system of the present disclosure determines a time varying pulse power function based on voltage sampling of charge/discharge pulses across a range of temperatures and SOCs. The system may determine the time varying function based on experimentally derived data. The time varying function may include an aging factor to compensate for age of the battery.

Figure 1:
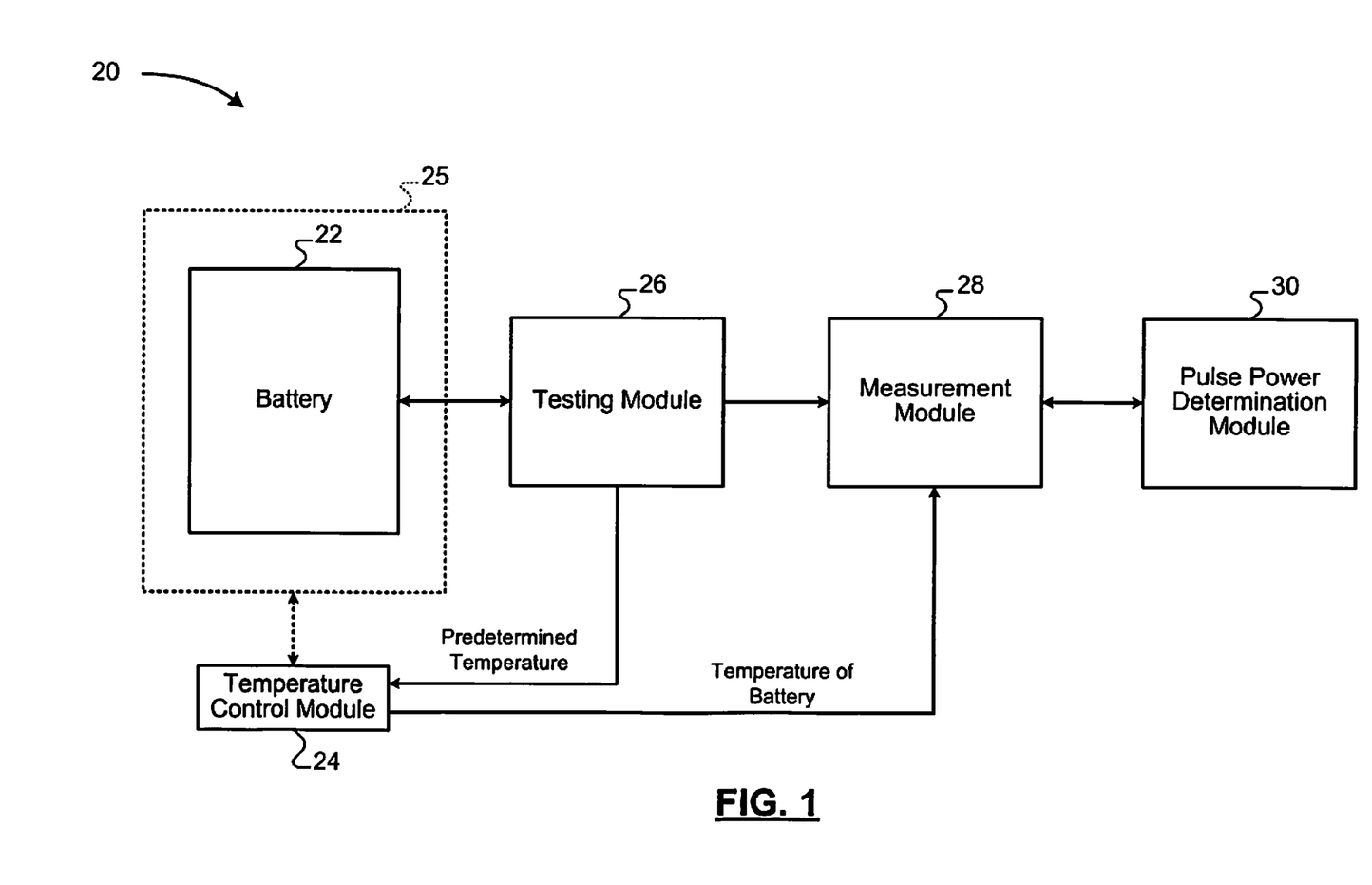
FIG. 1 is a functional block diagram of a battery analysis system according to the present disclosure.

Referring now to FIG. 1, a battery analysis system 20 includes a battery 22 that may store chemical energy for conversion to electrical energy. The battery 22 may include a single electrochemical cell. The battery 22 may include a plurality of electrochemical cells connected in series and/or in parallel. The battery 22 may include a rechargeable lithium-ion battery that may be used in hybrid electric vehicle applications.

The system 20 may include a temperature control module 24 that regulates a temperature of the battery 22. For example, the temperature control module 24 may heat or cool the battery 22 to maintain the temperature of the battery 22. The temperature control module 24 may actuate an environmental control chamber 25 to regulate the temperature of the battery 22. For example, the temperature of the battery 22 may be regulated in the environmental control chamber to temperatures in the range of −40-85° C. The temperature of the battery 22 may increase due to heat generated during operation of the battery 22. For example, the battery 22 may produce heat when the battery 22 is applying a current through a load. The battery 22 may include channels and/or a heat sink for dissipating heat generated during operation. The temperature control module 24 may measure the temperature of the battery 22. A testing module 26 may instruct the temperature control module 24 to heat or cool the battery 22 to a predetermined temperature.

The testing module 26 may discharge the battery 22. The testing module 26 may control an amount of current discharged from the battery 22. The amount of current discharged from the battery 22 may be referred to herein as a "discharge current." The testing module 26 may measure a voltage across the battery 22 when the battery 22 is providing the discharge current. The voltage measured across the battery 22 when the battery 22 is providing the discharge current may be referred to herein as a "discharge voltage."

The testing module 26 may charge the battery 22. The testing module 26 may apply an amount of current to charge the battery 22. The amount of current applied to charge the battery 22 may be referred to herein as a "charge current." The testing module 26 may measure a voltage across the battery 22 when the testing module 26 applies the charge current to the battery 22. The voltage measured across the battery 22 when the testing module 26 applies the charge current to the battery 22 may be referred to herein as a "charge voltage." The testing module 26 outputs the values of the discharge/charge voltage and discharge/charge current to a measurement module 28.

While the present disclosure describes the testing module 26 as controlling the amount of current discharged from the battery 22, the testing module 26 may also control the voltage across the battery 22. For example, the testing module 26 may control the voltage across the battery 22 to discharge the battery 22. The testing module 26 may measure a current discharged from the battery 22 when the testing module 26 controls the voltage across the battery 22. The testing module 26 may also charge the battery 22 by controlling a voltage applied to the battery 22. The testing module 26 may measure an amount of current supplied to the battery 22 when controlling the voltage applied to the battery 22.

The testing module 26 may determine the SOC of the battery 22. The SOC may indicate an energy capacity of the battery 22 relative to a rated energy capacity of the battery 22. The rated energy capacity of the battery 22 may indicate an energy capacity of the battery 22 when the battery 22 is new and fully charged. The SOC may be expressed as a percentage. For example, the battery 22 may be at a 100% SOC when the battery 22 is new and fully charged. The battery 22 may be at a 0% SOC when the battery 22 is fully discharged. The testing module 26 may determine the SOC of the battery 22 based on an open circuit voltage ($V_{OC}$) of the battery 22. The testing module 26 may also determine the SOC of the battery 22 based on an amount of current that enters or leaves the battery 22 during a period.

The measurement module 28 receives values of the discharge/charge voltages and values of the discharge/charge currents from the testing module 26. The measurement module 28 determines a discharge resistance based on the discharge voltage and the discharge current. For example, the measurement module 28 may divide the change in discharge voltage by the change in discharge current to determine the discharge resistance according to the following equation:

$$R_D(t, T, SOC) = \frac{\Delta V}{\Delta I} = \frac{V(0; T, SOC) - V(t; T, SOC)}{I(0; T, SOC) - I(t; T, SOC)}. \quad \text{(Eq. 1)}$$

The measurement module 28 determines a charge resistance based on the charge voltage and the charge current. For example, the measurement module 28 may divide the change in charge voltage by the change in charge current to determine the charge resistance according to the following equation:

$$R_C(t, T, SOC) = \frac{\Delta V}{\Delta I} = \frac{V(t; T, SOC) - V(0; T, SOC)}{I(t; T, SOC) - I(0; T, SOC)}. \quad \text{(Eq. 2)}$$

The measurement module outputs the discharge resistance and the charge resistance to a pulse power determination module 30.

The battery analysis system 20 performs a pulse power characterization test to determine a pulse power capability of the battery 22 over a range of SOCs and temperatures. The pulse power capability indicates a power the battery 22 may deliver/receive during a period when the battery 22 is discharging/charging. For example only, the battery 22 may discharge/charge for a period in the range of 3-10 seconds.

Figure 2:
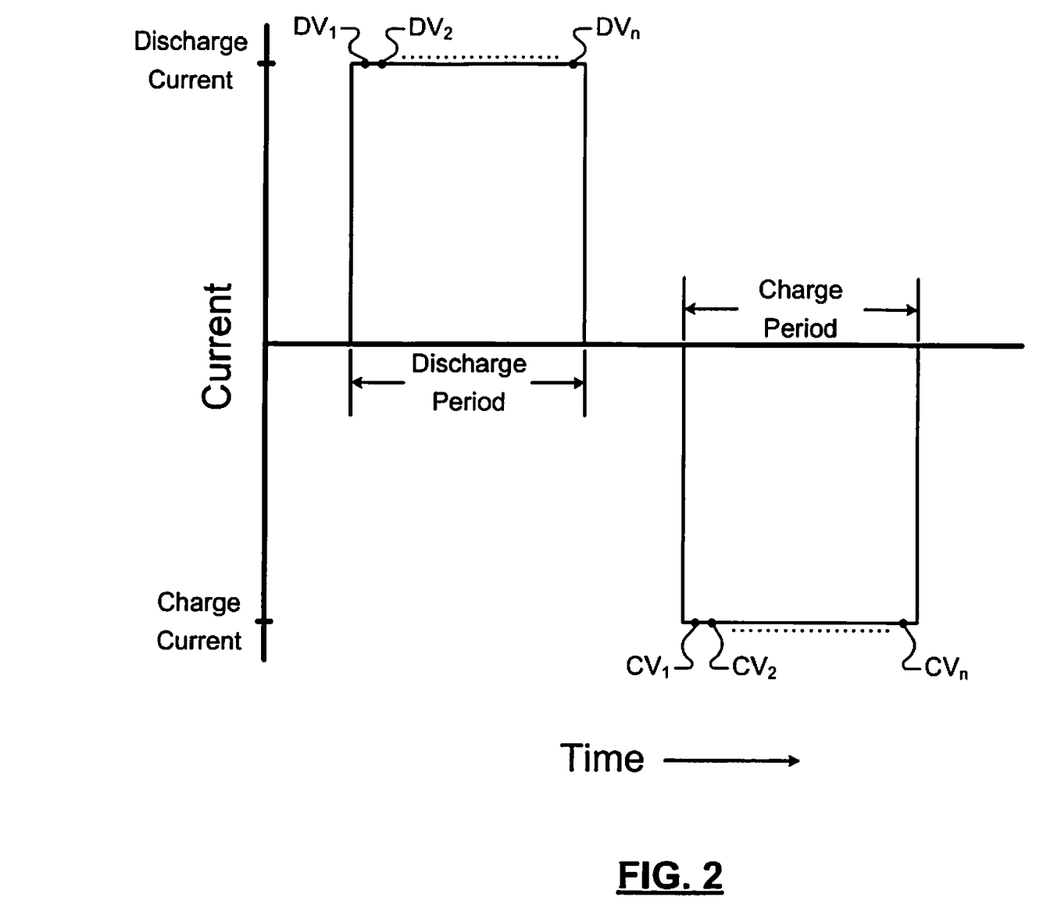
FIG. 2 illustrates a pulse power characterization test for a single state of charge according to the present disclosure.

Referring now to FIG. 2, an exemplary pulse power characterization test for a predetermined SOC at the predetermined temperature is shown. The testing module 26 controls the discharge current during a discharge period. The testing module 26 measures a plurality of discharge voltages ($DV_1$, $DV_2, \ldots,$ and $DV_n$) across the battery 22 during the discharge period. For example, the discharge period may include a duration of 18 seconds and the testing module 26 may measure the discharge voltage at least once per second. The testing module 26 outputs the discharge current, the plurality of discharge voltages, and the predetermined SOC to the measurement module 28.

The measurement module 28 receives the discharge current and the plurality of discharge voltages corresponding to the predetermined SOC. The measurement module 28 receives the predetermined temperature from the temperature control module 24. The measurement module 28 determines a plurality of discharge resistances based on the discharge current and the plurality of discharge voltages. For example, the measurement module 28 may divide each of the plurality of discharge voltages by the discharge current to determine the plurality of discharge resistances. The measurement module 28 may determine a discharge resistance function that varies with time based on the plurality of discharge resistances, the predetermined SOC, and the predetermined temperature. For example, the measurement module 28 may determine the discharge resistance function based on the following relationship:

$$R_D(t; SOC, T) = R_0 + a \cdot [1 - e^{(-b \cdot t)}],$$

where $R_D(t; SOC, T)$ denotes the discharge resistance function that varies with time (t) for the predetermined SOC and the predetermined temperature (T). The measurement module 28 determines $R_0$, a, and b to fit the discharge resistance function to the plurality of discharge resistances (e.g., discharge resistances determined using Eq. 1). Experimentally, the discharge resistance of the battery 22 may follow a non-linear function. The discharge resistance function may include an exponential term $e^{(-b \cdot t)}$ to allow for a non-linear fit of the discharge resistance function to the plurality of the discharge resistances.

The discharge resistance function may include an aging coefficient ($\beta_1$) that compensates for aging of the battery 22. The measurement module 28 may multiply the discharge resistance function by the aging coefficient to determine the discharge resistance based on an age of the battery 22 (e.g., $\beta_1 \cdot R_D$).

Following the discharge period, the testing module 26 may apply the charge current to the battery 22 for a charge period. The testing module 26 measures a plurality of charge voltages ($CV_1$, $CV_2$, ..., and $CV_n$) during the charge period. For example, the charge period may include a duration of 10 seconds, and the testing module 26 may measure the charge voltage at least once per second. The testing module 26 outputs the charge current, the plurality of charge voltages, and the predetermined SOC to the measurement module 28.

The measurement module 28 receives the charge current and the plurality of charge voltages corresponding to the predetermined SOC. The measurement module 28 receives the predetermined temperature from the temperature control module 24. The measurement module 28 determines a plurality of charge resistances based on the charge current and the plurality of charge voltages. For example, the measurement module 28 may divide each of the plurality of charge voltages by the charge current to determine the plurality of charge resistances. The measurement module 28 may determine a charge resistance function that varies with time based on the plurality of charge resistances, the predetermined SOC, and the predetermined temperature. For example, the measurement module 28 may determine the charge resistance function based on the following relationship:

$$R_C(t; SOC, T) = R_0 + a \cdot [1 - e^{(-b \cdot t)}],$$

where $R_C(t; SOC, T)$ denotes the charge resistance function that varies with time (t) for the predetermined SOC and the predetermined temperature (T). The measurement module 28 may determine $R_0$, a, and b to fit the charge resistance function to the plurality of charge resistances (e.g., charge resistances determined using Eq. 2). Experimentally, the charge resistance of the battery 22 may follow a non-linear function. The charge resistance function may include the exponential term $e^{(-b \cdot t)}$ to allow for a non-linear fit of the charge resistance function to the plurality of charge resistances.

The charge resistance function may include an aging coefficient ($\beta_2$) that compensates for aging of the battery 22. The measurement module 28 may multiply the charge resistance function by the aging coefficient to determine the charge resistance based on an age of the battery 22 (e.g., $\beta_2 \cdot R_C$).

Hereinafter, a combination of the discharge period and the charge period is called a "pulse power period." The pulse power characterization test may include testing a plurality of pulse power periods at a plurality of SOCs and a plurality of temperatures.

Figure 3:
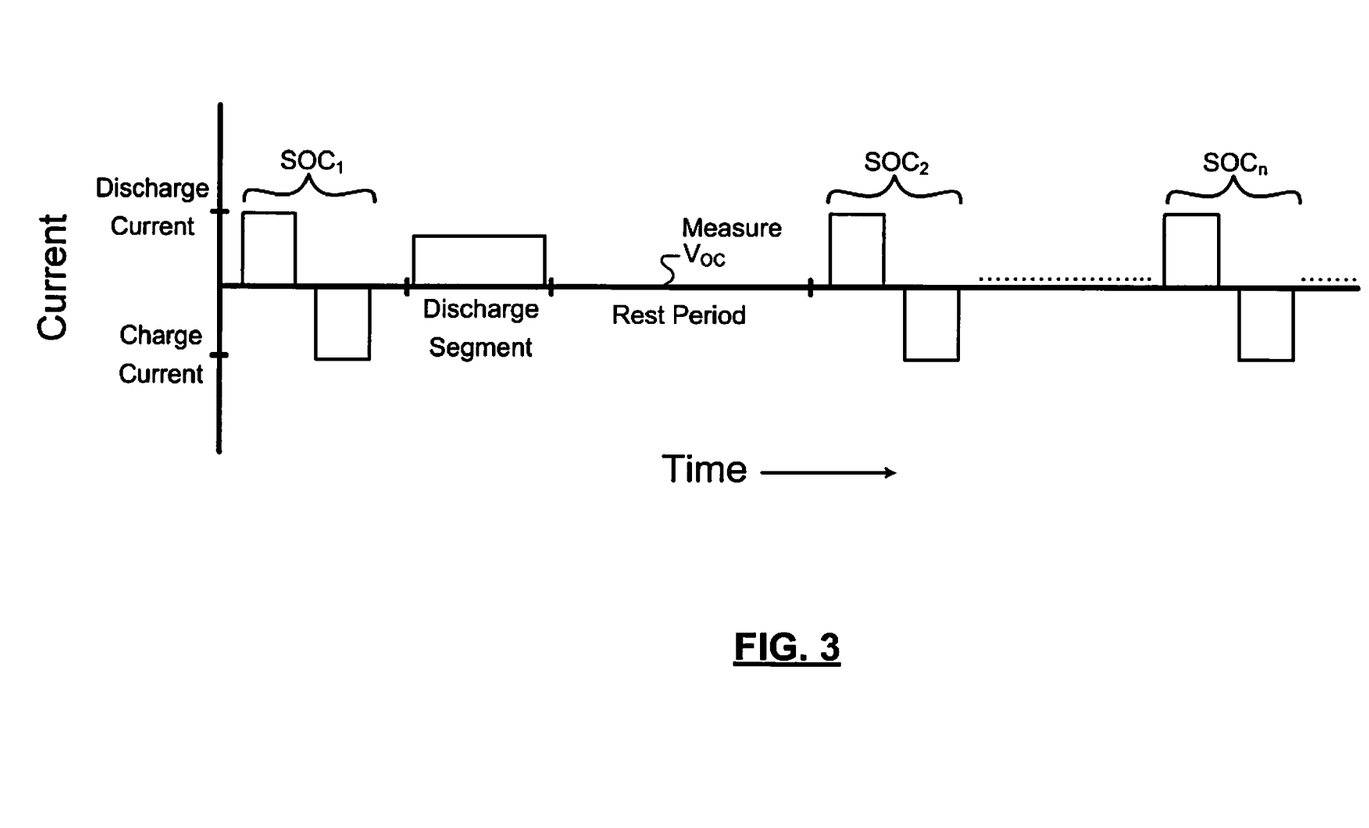
FIG. 3 illustrates a pulse power characterization test including multiple states of charge according to the present disclosure.

Referring now to FIG. 3, an exemplary pulse power characterization test includes testing a plurality of SOCs ($SOC_1$, $SOC_2$, ..., and $SOC_n$) at the predetermined temperature. The testing module 26 measures discharge voltages and charge voltages for the plurality of SOCs. Two pulse power periods may be separated by a discharge segment and a rest period. The discharge segment may include discharging the battery from a first predetermined SOC to a second predetermined SOC. For example, if the first predetermined SOC ($SOC_1$) corresponds to a 90% SOC, the second predetermined SOC ($SOC_2$) may correspond to an 80% SOC if 10% of the battery 22 capacity was discharged during the discharge segment.

The testing module 26 measures a voltage across the battery 22 during the rest period to determine the $V_{OC}$ of the battery 22. The testing module 26 may measure the $V_{OC}$ of the battery 22 for each of the plurality of SOCs at the predetermined temperature. The measurement module 28 receives each $V_{OC}$ from the testing module 26.

The system 20 may measure a plurality of pulse power periods and rest periods at a plurality of predetermined temperatures. The measurement module 28 may determine a plurality of discharge resistance functions corresponding to the plurality of SOCs and the plurality of predetermined temperatures. For example, the plurality of discharge resistance functions may be denoted as $R_{D(1,1)}(t; SOC_1, T_1)$, $R_{D(1,2)}(t; SOC_1, T_2)$, ..., and $R_{D(n,n)}(t; SOC_n, T_n)$. Where $R_{D(1,1)}$ denotes a discharge resistance function at the first predetermined SOC ($SOC_1$) and a first predetermined temperature ($T_1$). $R_{D(1,2)}$ denotes a discharge resistance function at the first predetermined SOC ($SOC_1$) and a second predetermined temperature ($T_2$). $R_{D(n,n)}$ denotes a discharge resistance function at an n-th SOC ($SOC_n$) and an n-th temperature ($T_n$).

The measurement module 28 may determine a plurality of charge resistance functions corresponding to the plurality of SOCs and the plurality of predetermined temperatures. For example, the plurality of charge resistance functions may be denoted as $R_{C(1,1)}(t; SOC_1, T_1)$, $R_{C(1,2)}(t; SOC_1, T_2)$, ..., and $R_{C(n,n)}(t; SOC_n, T_n)$.

The measurement module 28 receives the $V_{OC}$s that correspond to the plurality of SOCs and the plurality of predetermined temperatures. The measurement module 28 outputs, to the pulse power determination module, the discharge resistance function, the charge resistance function, and the $V_{OC}$ for a single predetermined temperature and SOC. For example, the measurement module 28 outputs $R_{D(1,1)}(t; SOC_1, T_1)$, $R_{C(1,1)}(t; SOC_1, T_1)$, and $V_{OC(1,1)}$ to the pulse power determination module 30, where $V_{OC(1,1)}$ denotes the $V_{OC}$ measured for the first predetermined SOC ($SOC_1$) and the first predetermined temperature ($T_1$).

The pulse power determination module 30 determines the pulse power capability of the battery 22. The pulse power determination module 30 determines a discharge pulse power capability based on the discharge resistance function, the corresponding $V_{OC}$, and a floor voltage ($V_{floor}$). $V_{floor}$ may indicate a minimum voltage of the battery 22 set according to an intended application. $V_{floor}$ may be determined by design of the battery 22, electrochemistry of the battery 22, and voltage limits of the intended application of the battery 22. The pulse power determination module 30 may determine the discharge pulse power capability of the battery 22 based on the following equation:

$$P_D(t; SOC, T) = \frac{v_{OC} \cdot (v_{OC} - v_{floor})}{R_D},$$

where $P_D$ denotes the discharge pulse power capability of the battery 22.

The pulse power determination module 30 may determine a plurality of discharge pulse power capabilities of the battery 22 for various SOCs and various temperatures. For example, the plurality of discharge pulse power capabilities may be denoted as:

$$P_{D(1,1)}(t; SOC_1, T_1) = \frac{v_{OC(1,1)} \cdot (v_{OC(1,1)} - v_{floor})}{R_{D(1,1)}},$$

-continued $$P_{D(1,2)}(t, SOC_1, T_2) = \frac{V_{OC(1,2)} \cdot (V_{OC(1,2)} - V_{floor})}{R_{D(1,2)}}, \text{ and}$$

$$P_{D(n,n)}(t, SOC_n, T_n) = \frac{V_{OC(n,n)} \cdot (V_{OC(n,n)} - V_{floor})}{R_{D(n,n)}},$$

where $P_{D(1,1)}$, $V_{OC(1,1)}$, and $R_{D(1,1)}$ denote the discharge pulse power capability, the $V_{OC}$, and the discharge resistance at $SOC_1$ and $T_1$, respectively. $P_{D(n,n)}$, $V_{OC(n,n)}$, and $R_{D(n,n)}$ may denote the discharge pulse power capability, the $V_{OC}$, and the discharge resistance at $SOC_n$ and $T_n$, respectively.

The pulse power determination module 30 determines a charge pulse power capability based on the charge resistance function, the corresponding $V_{OC}$, and a ceiling voltage ($V_{ceiling}$). $V_{ceiling}$ may indicate a maximum voltage of the battery 22 set according to an intended application. $V_{ceiling}$ may be determined by design of the battery 22, electrochemistry of the battery 22, and voltage limits of the intended application of the battery 22. The pulse power determination module 30 may determine the charge pulse power capability of the battery 22 based on the following equation:

$$P_C(t, SOC, T) = \frac{V_{OC} \cdot (V_{ceiling} - V_{OC})}{R_C},$$

where $P_C$ denotes the charge pulse power capability of the battery 22.

The pulse power determination module 30 may determine a plurality of charge pulse power capabilities of the battery 22 for various SOCs and various temperatures. For example, the plurality of charge pulse power capabilities may be denoted as:

$$P_{C(1,1)}(t, SOC_1, T_1) = \frac{V_{OC(1,1)} \cdot (V_{ceiling} - V_{OC(1,1)})}{R_{C(1,1)}},$$

$$P_{C(1,2)}(t, SOC_1, T_2) = \frac{V_{OC(1,2)} \cdot (V_{ceiling} - V_{OC(1,2)})}{R_{C(1,2)}} \ldots, \text{ and}$$

$$P_{C(n,n)}(t, SOC_n, T_n) = \frac{V_{OC(n,n)} \cdot (V_{ceiling} - V_{OC(n,n)})}{R_{C(n,n)}},$$

where $P_{C(1,1)}$, $V_{OC(1,1)}$, and $R_{C(1,1)}$ denote the charge pulse power capability, the $V_{OC}$, and the charge resistance at $SOC_1$ and $T_1$, respectively.

The pulse power capability of the battery 22 may be used in development and testing of a battery pack (not shown). The battery pack may include a plurality of batteries 22. For example, the battery pack may include a plurality of electrochemical cells connected in series and/or in parallel. The pulse power determination module 30 may determine a number of cells to connect in series and/or in parallel to generate a predetermined pulse power capability based on the pulse power capability of the battery 22. The system may determine whether the battery pack is prematurely aging or failing based on the pulse power capability of the battery 22. For example, measurements of a pulse power capability of the battery pack may be compared to the pulse power capability of the battery 22 to determine whether the battery pack has prematurely aged or failed.

Figure 4:
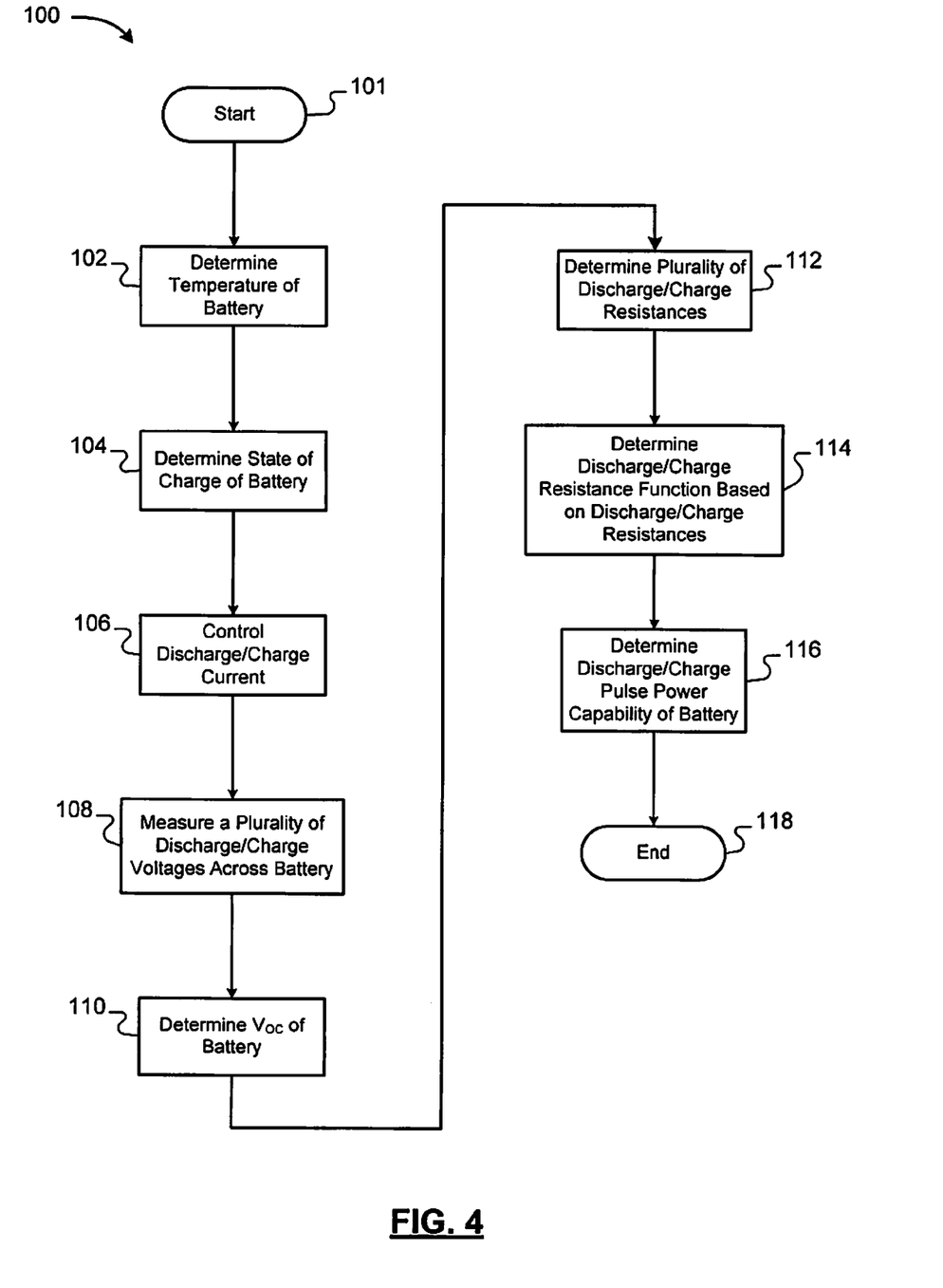
FIG. 4 is a flowchart that illustrates a method for analyzing a battery according to the present disclosure.

Referring now to FIG. 4, a flowchart 100 that illustrates a method for analyzing a battery starts in step 101. In step 102, the temperature control module 24 determines the temperature of the battery 22. In step 104, the testing module 26 determines the SOC of the battery 22. In step 106, the testing module 26 controls the discharge/charge current. In step 108, the testing module 26 measures a plurality of discharge/charge voltages across the battery 22. In step 110, the testing module 26 determines the $V_{OC}$ of the battery 22 corresponding to the SOC of the battery 22. In step 112, the measurement module 28 determines the plurality of discharge/charge resistances based the plurality of discharge/charge voltages. In step 114, the measurement module 28 determines the discharge/charge resistance function that varies with time based on the plurality of discharge/charge resistances. In step 116, the pulse power determination module 30 determines the discharge/charge pulse power capability of the battery 22. The method ends in step 118.

Those skilled in the art can now appreciate from the foregoing description that the broad teachings of the present disclosure can be implemented in a variety of forms. Therefore, while this disclosure has been described in connection with particular examples thereof, the true scope of the disclosure should not be so limited since other modifications will become apparent to the skilled practitioner upon a study of the drawings, specification, and the following claims.

What is claimed is:

1. A battery analysis system, comprising:
   a control module that controls current to a battery to one of charge and discharge the battery;
   a measurement module that determines N voltages across the battery at N times during a period when the control module controls the current and when the battery is at a predetermined temperature and a predetermined state of charge, wherein N is an integer greater than 1; and
   a pulse power module that determines N resistances corresponding to the current and the N voltages across the battery and that determines a pulse power value of the battery based on the N resistances,
   wherein the pulse power value indicates a dynamic power of the battery to one of charge and discharge.

2. The battery analysis system of claim 1 wherein the pulse power module determines a time dependent resistance function based on the N resistances and determines the pulse power value based on the resistance function.

3. The battery analysis system of claim 2 wherein the measurement module determines the N voltages when the battery is at C predetermined states of charge and T predetermined temperatures, wherein C and T are integers greater than 1.

4. The battery analysis system of claim 3 wherein the pulse power module determines X time dependent resistance functions based on the C predetermined states of charge and the T predetermined temperatures, wherein X=C×T.

5. The battery analysis system of claim 4 wherein the pulse power module determines the pulse power value of the battery based on the X resistance functions.

6. The battery analysis system of claim 2 wherein the pulse power module determines the pulse power value of the battery based on the resistance function, an open circuit voltage of the battery, and at least one of a maximum and minimum operating voltage of the battery.

7. The battery analysis system of claim 1 wherein the measurement module actuates an environmental control chamber to control a temperature of the battery at the predetermined temperature.

8. The battery analysis system of claim 1 wherein the pulse power value is used to determine a battery pack arrangement that is capable of generating a predetermined pulse power value.

9. A battery analysis system, comprising:
- a control module that controls voltage across a battery to one of charge and discharge the battery;
- a measurement module that determines N currents through the battery at N times during a period when the control module controls the voltage and when the battery is at a predetermined temperature and a predetermined state of charge, wherein N is an integer greater than 1; and
- a pulse power module that determines N resistances corresponding to the voltage and the N currents through the battery and that determines a pulse power value of the battery based on the N resistances,
- wherein the pulse power value indicates a dynamic power of the battery to one of charge and discharge.

10. The battery analysis system of claim 9 wherein the pulse power module determines a time dependent resistance function based on the N resistances and determines the pulse power value based on the resistance function.

11. The battery analysis system of claim 10 wherein the measurement module determines the N currents when the battery is at C predetermined states of charge and T predetermined temperatures, wherein C and T are integers greater than 1.

12. The battery analysis system of claim 11 wherein the pulse power module determines X time dependent resistance functions based on the C predetermined states of charge and the T predetermined temperatures, wherein $X = C \times T$.

13. The battery analysis system of claim 12 wherein the pulse power module determines the pulse power value of the battery based on the X resistance functions.

14. The battery analysis system of claim 10 wherein the pulse power module determines the pulse power value of the battery based on the resistance function, an open circuit voltage of the battery, and at least one of a maximum and minimum operating voltage of the battery.

15. The battery analysis system of claim 9 wherein the measurement module actuates an environmental control chamber to control a temperature of the battery at the predetermined temperature.

16. The battery analysis system of claim 9 wherein the pulse power value is used to determine a battery pack arrangement that is capable of generating a predetermined pulse power value.

17. A method comprising:
- setting a temperature of a battery to a predetermined temperature;
- discharging the battery when the battery is at the predetermined temperature and a predetermined state of charge;
- determining a plurality of resistances based on a voltage across the battery and current through the battery when the battery is discharging at the predetermined temperature; and
- determining a pulse power value of the battery based on the plurality of resistances, wherein the pulse power value indicates a dynamic power of the battery to one of charge and discharge.

18. The method of claim 17 further comprising determining a time dependent resistance function based on the plurality of resistances and determining the pulse power value based on the resistance function.

19. The method of claim 18 further comprising determining the plurality of resistances when the battery is at M predetermined states of charge and N predetermined temperatures, wherein M and N are integers greater than 1.

20. The method of claim 19 further comprising determining X time dependent resistance functions based on the M predetermined states of charge and the N predetermined temperatures, wherein $X = M \times N$.

21. The method of claim 20 further comprising determining the pulse power value of the battery based on the X resistance functions.

22. The method of claim 18 further comprising determining the pulse power value of the battery based on the resistance function, an open circuit voltage of the battery, and at least one of a maximum and minimum operating voltage of the battery.

23. The method of claim 17 further comprising determining a battery pack arrangement that is capable of generating a predetermined pulse power value based on the pulse power value of the battery.

* * * * *

UNITED STATES PATENT AND TRADEMARK OFFICE
CERTIFICATE OF CORRECTION

| | | |
|---|---|---|
| PATENT NO. | : 8,008,893 B2 | |
| APPLICATION NO. | : 12/401218 | |
| DATED | : August 30, 2011 | |
| INVENTOR(S) | : Joel Ray Stanley | |

It is certified that error appears in the above-identified patent and that said Letters Patent is hereby corrected as shown below:

Column 8, Line 8    Insert --on-- after "based"

Signed and Sealed this
Eighteenth Day of October, 2011

David J. Kappos
*Director of the United States Patent and Trademark Office*